United States Patent
Takamatsu

(10) Patent No.: US 11,424,384 B2
(45) Date of Patent: Aug. 23, 2022

(54) LIGHT-EMITTING DEVICE AND METHOD OF MANUFACTURING THE SAME

(71) Applicant: NICHIA CORPORATION, Anan (JP)

(72) Inventor: Tomoki Takamatsu, Anan (JP)

(73) Assignee: NICHIA CORPORATION, Anan (JP)

( * ) Notice: Subject to any disclaimer, the term of this patent is extended or adjusted under 35 U.S.C. 154(b) by 73 days.

(21) Appl. No.: 17/112,978

(22) Filed: Dec. 4, 2020

(65) Prior Publication Data

US 2021/0091261 A1 Mar. 25, 2021

Related U.S. Application Data

(62) Division of application No. 16/366,646, filed on Mar. 27, 2019, now Pat. No. 10,886,430.

(30) Foreign Application Priority Data

Mar. 29, 2018 (JP) .............................. JP2018-064859

(51) Int. Cl.
*H01L 33/00* (2010.01)
*H01L 33/60* (2010.01)
(Continued)

(52) U.S. Cl.
CPC ...... *H01L 33/0095* (2013.01); *H01L 25/0652* (2013.01); *H01L 33/507* (2013.01);
(Continued)

(58) Field of Classification Search
CPC combination set(s) only.
See application file for complete search history.

(56) References Cited

U.S. PATENT DOCUMENTS

2010/0258830 A1* 10/2010 Ide .......................... H01L 24/97
257/E33.059
2014/0151734 A1 6/2014 Ito et al.
(Continued)

FOREIGN PATENT DOCUMENTS

JP 2010238846 A 10/2010
JP 2015012081 A 1/2015
(Continued)

OTHER PUBLICATIONS

United States Patent and Trademark Office, Non-Final Office Action, issued to U.S. Appl. No. 16/366,646 dated May 14, 2020, 16 pages.
(Continued)

*Primary Examiner* — Moin M Rahman
(74) *Attorney, Agent, or Firm* — Hunton Andrews Kurth LLP

(57) ABSTRACT

A method of manufacturing a light-emitting device includes: arranging a plurality of light-emitting elements each having an upper surface; disposing a first reflective member between the plurality of light-emitting elements such that the upper surface of each of the plurality of light-emitting elements are exposed and such that lateral surfaces of the light-emitting elements are covered with the first reflective member; disposing a light-transmissive member over the upper surface of each of the plurality of light-emitting elements and the first reflective member; forming a plurality of grooves surrounding one or two or more light-emitting elements by removing a portion of the light-transmissive member and a portion of the first reflective member; disposing a second reflective member to fill the plurality of grooves; and cutting the second reflective member to perform singulation.

18 Claims, 8 Drawing Sheets

(51) Int. Cl.
  *H01L 33/50* (2010.01)
  *H01L 33/62* (2010.01)
  *H01L 25/065* (2006.01)

(52) U.S. Cl.
  CPC .............. *H01L 33/60* (2013.01); *H01L 33/62* (2013.01); *H01L 2933/0033* (2013.01); *H01L 2933/0041* (2013.01); *H01L 2933/0058* (2013.01)

(56) References Cited

U.S. PATENT DOCUMENTS

| | | |
|---|---|---|
| 2015/0001563 A1 | 1/2015 | Miki |
| 2015/0050760 A1 | 2/2015 | Imazu et al. |
| 2015/0311405 A1 | 10/2015 | Oyamada et al. |
| 2016/0190400 A1 | 6/2016 | Jung et al. |
| 2017/0062681 A1 | 3/2017 | Miyoshi et al. |
| 2017/0077367 A1 | 3/2017 | Shimojuku et al. |
| 2017/0117446 A1 | 4/2017 | Tsuchiya et al. |
| 2017/0133562 A1 | 5/2017 | Ling et al. |
| 2017/0179344 A1 | 6/2017 | Matsuda |
| 2018/0269364 A1 | 9/2018 | Hoppel |
| 2019/0305177 A1 | 10/2019 | Takamatsu |

FOREIGN PATENT DOCUMENTS

| | | |
|---|---|---|
| JP | 2015053326 A | 3/2015 |
| JP | 2017050328 A | 3/2017 |
| JP | 2017050359 A | 3/2017 |
| JP | 2017055038 A | 3/2017 |
| JP | 2017076673 A | 4/2017 |
| JP | 2017079311 A | 4/2017 |
| JP | 2017092449 A | 5/2017 |
| JP | 2017118098 A | 6/2017 |
| JP | 2017212470 A | 11/2017 |
| JP | 2018508984 A | 3/2018 |
| WO | 2009066430 A1 | 5/2009 |
| WO | 2013011628 A1 | 1/2013 |
| WO | 2013/137356 A1 | 9/2013 |
| WO | 2014/081042 A1 | 5/2014 |
| WO | 2014091914 A1 | 6/2014 |

OTHER PUBLICATIONS

United States Patent and Trademark Office, Restriction Requirement, issued to U.S. Appl. No. 16/366,646 dated Feb. 28, 2020, 8 pages.

\* cited by examiner

LIGHT-EMITTING DEVICE AND METHOD OF MANUFACTURING THE SAME

CROSS-REFERENCE TO RELATED APPLICATION

This is a divisional application of U.S. patent application Ser. No. 16/366,646, filed Mar. 27, 2019, which claims priority to Japanese Patent Application No. 2018-064859, filed on Mar. 29, 2018, the disclosure of which is hereby incorporated by reference in its entirety.

BACKGROUND OF THE INVENTION

Field of the Invention

The present disclosure relates to a light-emitting device and a method of manufacturing the light-emitting device.

Description of Related Art

A known method of manufacturing a light-emitting device including a light-emitting element covered with resin or the like includes disposing a plurality of light-emitting elements, filling the resin into gaps between the light-emitting elements, and then cutting the resin to singulate the light-emitting device (for example, see Japanese Unexamined Patent Application Publication No. 2017-050328).

SUMMARY OF THE INVENTION

The light-emitting device manufactured using the above method may be required to have visibility.

According to the present disclosure, a light-emitting device having good visibility and a method of efficiently manufacturing the light-emitting device can be obtained.

A method of manufacturing a light-emitting device according to one embodiment of the present disclosure includes: arranging a plurality of light-emitting elements each having an upper surface; disposing a first reflective member between the plurality of light-emitting elements such that the upper surface of each of the plurality of light-emitting elements are exposed and such that lateral surfaces of the light-emitting elements are covered with the first reflective member; disposing a light-transmissive member over the upper surface of each of the plurality of light-emitting elements and the first reflective member; forming a plurality of grooves surrounding one or two or more light-emitting elements by removing a portion of the light-transmissive member and a portion of the first reflective member; disposing a second reflective member to fill the plurality of grooves; and cutting the second reflective member to perform singulation.

A light-emitting device according to one embodiment of the present disclosure includes at least one light-emitting element including lateral surfaces, a light-extracting surface; a first reflective member including an upper surface, covering the lateral surfaces of the light-emitting element; a covering member including lateral surfaces and a lower surface and disposed over the light-extracting surface of the light-emitting element and the upper surface of the first reflective member; a light-transmissive member including lateral surfaces and disposed on the covering member and comprising a phosphor; and a second reflective member covering the lateral surfaces of the light-transmissive member and the lateral surfaces of the covering member. The lower surface of the covering member in contact with the upper surface of the first reflective member is curved. The covering member has a first thickness at a first position, which is located near the light emitting element, and a second thickness at a second position, which is located farther from the light-emitting element than the first position, such that the second thickness greater than the first thickness.

The present disclosure allows for providing a light-emitting device having good distinguishability and allows for efficiently manufacturing the light-emitting device.

DETAILED DESCRIPTION OF EMBODIMENTS

Figure 1A:
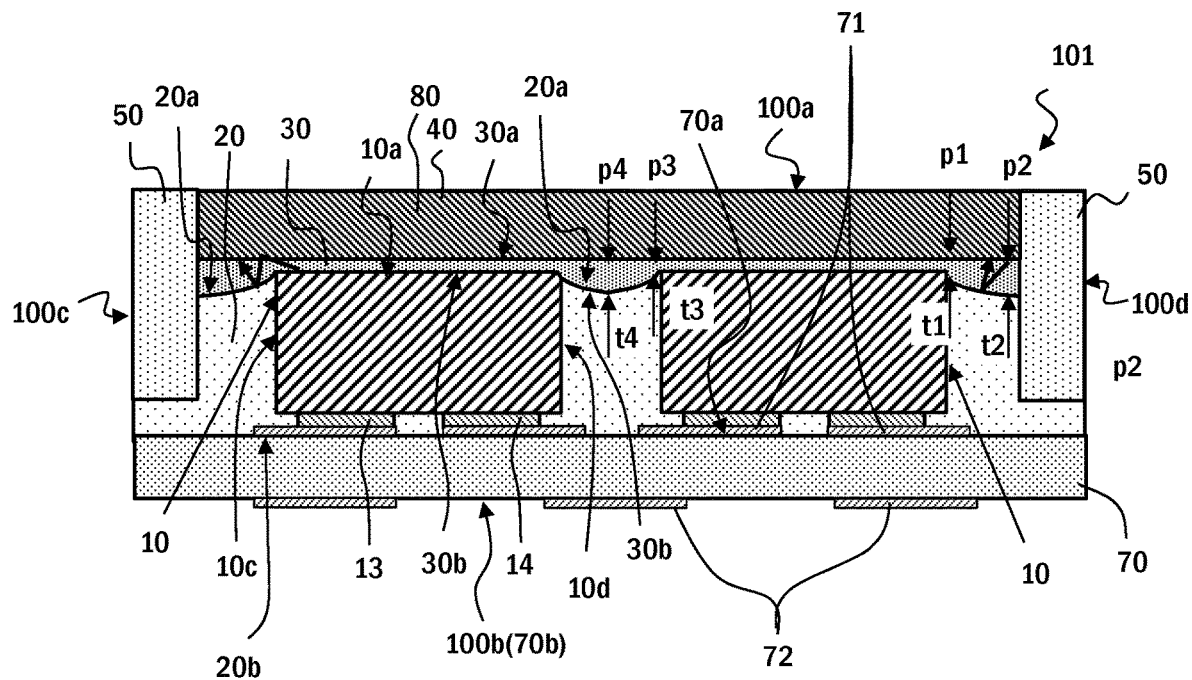
FIG. 1A is a schematic cross-sectional view of a light-emitting device according to a first embodiment of the present disclosure.

The light-emitting devices and methods for manufacturing the light-emitting devices according to certain embodiments will be described below. The drawings referred to in the descriptions below schematically illustrate certain embodiments. The scales, the distances, the positional relationships, and the like of members may be exaggerated, or illustration of some members may be omitted. Constitutions described regarding a single embodiment are applicable to other embodiments and modifications. In the descriptions below, the same term or reference numeral generally represents the same member or a member made of the same material, and its detailed description may be omitted as appropriate.

First Embodiment

Light-Emitting Device 101

Figure 1B:
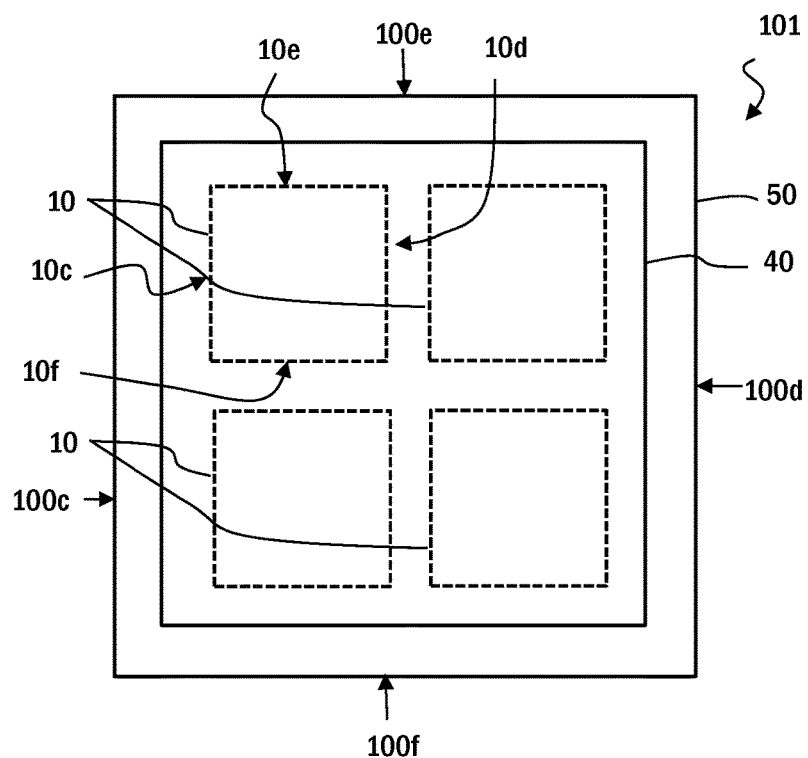
FIG. 1B is a schematic top view of the light-emitting device shown in FIG. 1A.

FIG. 1A is a schematic cross-sectional view of a light-emitting device according to a first embodiment. FIG. 1B is a schematic top view of the light-emitting device shown in FIG. 1A. A light-emitting device 101 includes at least one light-emitting element 10, a first reflective member 20 covering lateral surfaces of the light-emitting element 10 and having an upper surface, a covering member 30 over a light-extracting surface of the light-emitting element 10 and the upper surface of the first reflective member 20, a light-transmissive member 40 on the covering member 30, the light-transmissive member 40 having lateral surfaces and containing a phosphor 80, and a second reflective member 50 covering the lateral surfaces of the light-transmissive member 40 and the covering member 30. The light-emitting device 101 may or may not include a board 70. In the present embodiment, the light-emitting device 101 has a substantially rectangular shape in a top view and has upper surface 100a, lower surface 100b, and lateral surfaces 100c, 100d, 100e, and 100f, each of which has a substantially rectangular shape. While the light-emitting device 101 includes four light-emitting elements 10 in the present embodiment, the light-emitting device 101 may include at least one light-emitting element 10. The covering member 30 has a curved lower surface in contact with the upper surface of the first reflective member 20. The covering member 30 has a first thickness at a first position, which is located near the light-emitting element 10, and a second thickness at a second position, which is located farther from a light-emitting element 10 than the first position.

Constituent elements will be described below in detail.

The board 70 is made of, for example, a resin, a ceramic, metal, or a composite material of these. An insulating resin can be selected in view of low cost and easiness of molding. A ceramic can be selected in view of resistance to heat and light. Examples of the resin that can be used for the board 70 include phenolic resins, epoxy resins, silicone resins, polyimide resins, bismaleimide triazine resins, polyphthalamide (PPA), and poly(ethylene terephthalate) (PET). Examples of the ceramic that can be used for the board 70 include alumina, mullite, forsterite, glass ceramics, and nitride (such as AlN) and carbide (such as SiC) ceramics. Among these materials, a ceramic made of alumina or containing alumina as a main component is preferable.

In the case where a resin is used for the material constituting the board 70, an inorganic filler, such as glass fiber, $SiO_2$, $TiO_2$, and $Al_2O_3$, can be mixed into the resin to improve the mechanical strength, to reduce the thermal expansion coefficient, and to improve the light reflectance. The board 70 may be a composite board in which an insulating layer is formed on a metal plate.

A plurality of electrodes 71 serving as terminals for wiring are disposed on an upper surface 70a of the board 70, and a plurality of electrodes 72 are disposed on a lower surface 70b. The lower surface of the board 70 serves as the lower surface 100b of the light-emitting device 101. Each of the electrodes 71 is electrically connected to a respective one of the electrodes 72 via a respective one of wirings disposed inside the board 70. The material for the electrodes 71 and 72 can be selected from electrically-conductive materials as appropriate according to the material for the board 70, the method of manufacturing the board 70, etc. For example, in the case where a ceramic is used for a material of the board 70, a material having a high melting point that can withstand a sintering temperature of a ceramic sheet is preferably used for the electrodes 71 and 72. A metal with a high melting point, such as tungsten and molybdenum, is preferably used for a material of the board 70. Alternatively, a wiring pattern made of a metal with a high melting point, such as those described above, may be provided, on which a layer of another metal material, such as nickel, gold, and silver, may be disposed by using, for example, plating, sputtering, or vacuum evaporation.

In the case of using a resin for a material of the board 70, a material that can be easily processed is preferably used for a material of the electrodes 71 and 72. In the case of using an injection-molded resin for a material of the board 70, a material easy to process by, for example, punching, etching, and bending and having relatively high mechanical strength is preferably used for the electrodes 71 and 72. More specifically, each of the electrodes 71 and 72 is preferably a metal layer or a lead frame made of a metal such as copper, aluminum, gold, silver, tungsten, iron, nickel, iron-nickel alloys, phosphor bronze, copper-iron alloys, or molybdenum. The electrodes 71 and 72 may be a wiring pattern made of the metal described above provided with a layer, which is made of another metal material, on a surface of the wiring pattern. The layer on the wiring pattern may be made of any appropriate material, and for example, a layer made of silver, a layer of an alloy of silver and another metal such as copper, gold, aluminum, or rhodium, or a multilayer in which silver or the alloys described above are layered may be used for the layer on the wiring pattern. The layer on the wiring pattern can be formed by, for example, plating, sputtering, or vacuum evaporation.

Light-Emitting Element 10

Figure 1C:
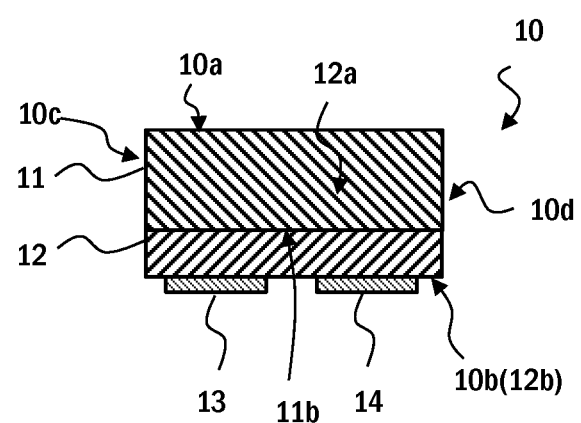
FIG. 1C is a schematic cross-sectional view of a light-emitting element in the light-emitting device shown in FIG. 1A.

FIG. 1C is a schematic cross-sectional view of one of the light-emitting elements in the light-emitting device shown in FIG. 1A. The light-emitting element 10 includes a light-transmissive substrate 11, a semiconductor multilayer structure 12, and electrodes 13 and 14. In the present embodiment, the light-emitting element 10 has a substantially rectangular shape in a top view. In other words, the light-emitting element 10 has substantially rectangular upper and lower surfaces 10a and 10b and lateral surfaces 10c, 10d, 10e, and 10f (see FIG. 1B). The shape of the light-emitting element 10 in a top view is not limited to a rectangular shape but may be another shape such as a hexagonal shape. The upper surface 10a is the light-extracting surface through which light is emitted from the light-emitting element 10.

The semiconductor multilayer structure 12 has an upper surface 12a and a lower surface 12b. The light-transmissive substrate 11 is disposed on the upper surface 12a, and the electrodes 13 and 14 are disposed on the lower surface 12b. A nitride semiconductor configured to emit short-wavelength light that can efficiently excite wavelength conversion substances is preferably used for the semiconductor multilayer structure 12. The nitride semiconductor is mainly represented by the general formula $In_xAl_yGa_{1-x-y}N$ (where $0 \leq x$, $0 \leq y$, and $x+y \leq 1$).

A substrate, such as a sapphire substrate, commonly used to manufacture a semiconductor light-emitting element is used for the light-transmissive substrate 11. The semiconductor multilayer structure 12 includes an n-type semiconductor layer and a p-type semiconductor layer. It is preferable that the semiconductor multilayer structure 12 further include an active layer between the n-type semiconductor layer and the p-type semiconductor layer.

Each of the electrodes 13 and 14 is electrically connected to a corresponding one of the n-type semiconductor layer and p-type semiconductor layer of the semiconductor multilayer structure 12. The electrodes 13 and 14 are made of a metal that is generally used as an electrode material for semiconductor devices. In the present embodiment, each of the electrodes 13 and 14 is bonded to a corresponding one of the electrodes 71 of the board 70 via, for example, bumps or solder.

In the present embodiment, in a top view, the light-emitting elements 10 are arranged in a two rows and two columns along two directions perpendicular to each other. Alternatively, the light-emitting elements may be one-dimensionally arranged.

First Reflective Member 20

The first reflective member 20 reflects light emitted from the light-emitting elements 10. The first reflective member 20 is disposed surrounding the light-emitting elements 10 to cover the lateral surfaces 10c to 10f of the light-emitting elements 10. The first reflective member 20 has an upper surface 20a and a lower surface 20b. In the present embodiment, the upper surface 20a of the first reflective member 20 defines a curved recess. More specifically, the upper surface 20a of the first reflective member 20 defines the recess between adjacent ones of the light-emitting elements 10 and between the light-emitting elements 10 and the second reflective member 50. The recess is formed in the directions each perpendicular to a corresponding one of the lateral surfaces 10c to 10f of the light-emitting elements in a top view.

In the case where the light-emitting device 101 does not include the board 70, the lower surface 20b of the first reflective member 20 serves as the lower surface 100b of the light-emitting device 101. The first reflective member 20 is exposed at the lateral surfaces 100c, 100d, 100e, and 100f of the light-emitting device 101.

The first reflective member 20 preferably has a high reflectance with respect to light emitted from the light-emitting elements 10 in view of the light extraction efficiency in the forward direction. More specifically, the first reflective member 20 preferably has the light reflectance at the emission peak wavelength of the light-emitting elements 10 of 70% or more, more preferably 80% or more, even more preferably 90% or more. In addition, the first reflective member 20 is preferably white. The first reflective member 20 preferably contains a base material and a white pigment dispersed in the base material.

For the base material of the first reflective member 20, a resin can be used, and examples of the resin include silicone resins, epoxy resins, phenolic resins, polycarbonate resins, acrylic resins, and modified resins of these resins. Among these resins, silicone resins and modified silicone resins, which have good heat and light resistance, are preferable. More specific examples of the silicone resins include dimethyl silicone resins, phenyl-methyl silicone resins, and diphenyl silicone resins. Various fillers may be contained in the above resin used for the base material of the first reflective member 20. For the filler, silicon oxide, aluminum oxide, zirconium oxide, zinc oxide, or the like can be used. One of these materials, or two or more of these materials in combination can be used for the filler. Silicon oxide, which has a small thermal expansion coefficient, is particularly preferable. Using nanoparticles as the filler allows for increasing scattering including Rayleigh scattering of blue light from the light-emitting element, so that the used amount of a wavelength conversion substance can be reduced. The "nanoparticles" in as used herein refers to particles having particle diameters in the range of 1 nm to 100 nm. The "particle diameter" in the present specification is defined as, for example, $D_{50}$.

For the white pigment, one of titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide can be used, or two or more of these can be used in combination. The white pigment may have any appropriate shape, and may have irregular or crushed shape, but preferably has a spherical shape in view of fluidity. The particle diameter of the white pigment is, for example, in the range of approximately 0.1 μm to 0.5 μm. The smaller the particle diameters are, the more preferable, to enhance effects of light reflection and covering. The content of the white pigment in the reflective member can be appropriately selected.

In view of light reflectivity, the viscosity in a fluid state, and the like, the content of the white pigment in the reflective member is preferably in the range of, for example, 10 wt % to 80 wt %, more preferably 20 wt % to 70 wt %, even more preferably 30 wt % to 60 wt %. The unit "wt %" as used herein refers to percentage by weight, that is, the proportion of the weight of a material to the total weight of the first reflective member 20.

Covering Member 30

The covering member 30 covers the light-emitting elements 10, which are covered with the first reflective member 20, and bonds the light-transmissive member 40 to the first reflective member 20 and the light-emitting elements 10. The covering member 30 is disposed on the upper surfaces 10a of the light-emitting elements 10 and the upper surface 20a of the first reflective member 20. The covering member 30 has an upper surface 30a and a lower surface 30b. The upper surface 30a of the covering member 30 is a substantially flat surface in contact with the light-transmissive member 40. On the other hand, the lower surface 30b of the covering member 30 on the first reflective member 20 has a shape corresponding to the shape of the upper surface 20a of the first reflective member 20. In other words, the lower surface 30b of the covering member 30 in contact with the upper surface 20a of the first reflective member 20 has a curved shape protruding toward the first reflective member 20.

In the region between each light-emitting element 10 and the second reflective member 50, the covering member 30 has a first thickness at a first position p1, which is located near the light-emitting element 10, and a second thickness at a second position p2, which is located farther from the light-emitting element 10 than the first position p1, such that the second thickness is greater than the first thickness. That is, when the first thickness at the first position p1 and the second thickness of the second position p2 of the covering member 30 are represented by t1 and t2, respectively, t2 is larger than t1.

In the region between two adjacent light-emitting elements 10, the thickness of the covering member 30 has a third thickness at a third position p3 near a corresponding one of the light-emitting elements 10, and a fourth thickness at a fourth position p4 near the midpoint between the two adjacent light-emitting elements 10, such that the fourth thickness greater than the third thickness. That is, when the third thickness at the third position p3 and the fourth position at the fourth position p4 of the covering member 30 are represented by t3 and t4, respectively, t4 is larger than t3.

The covering member 30 is preferably made of a material that has a high transmittance with respect to light at a wavelength of light emitted from the light-emitting elements 10 and has good resistance to weather, light, and heat as a sealing member. In addition, the covering member 30 preferably has a good adhesiveness. Examples of the material for the covering member 30 include thermoplastic resins and thermosetting resins. Examples of thermoplastic resins include polyphthalamide resins, liquid crystal polymers, poly(butylene terephthalate) (PBT), and unsaturated polyesters. Examples of thermosetting resins include epoxy resins, modified epoxy resins, silicone resins, and modified silicone resins.

Light-Transmissive Member 40

The light-transmissive member 40 is disposed on the upper surface 30a of the covering member 30 and is not in contact with the lateral surfaces 10c to 10f of the light-emitting elements 10. The light-transmissive member 40 contains the phosphor 80, with which the light-transmissive member 40 transmits light emitted from the light-emitting elements and directly incident on the light-transmissive member 40 and light reflected by the upper surface 20a of the first reflective member 20, while absorbing a portion of light emitted from the light-emitting elements and directly incident on the light-transmissive member 40 and a portion of light reflected by the upper surface 20a of the first reflective member 20 to convert into light with a different wavelength. For example, the light-emitting elements 10 is configured to emit blue light, and a portion of the blue light is converted into, for example, yellow light in the light-transmissive member 40. This structure allows the light-emitting device 101 to emit light of a mixed color (such as white light) of a color of light emitted from the light-emitting elements 10 and a color of light wavelength-converted in the light-transmissive member 40. The light-transmissive member 40 may contain a plurality of types of phosphors. The light-transmissive member 40 is preferably a sheet-like member containing the phosphor 80.

The light-transmissive member 40 may contain, for the base material, a silicone resin, an epoxy resin, a phenolic resin, a polycarbonate resin, an acrylic resin, a modified resin of these resins, glass, or other materials. Among these materials, a silicone resin and a modified silicone resin, which have good heat and light resistance, may be preferably used for the base material. For example, a dimethyl silicone resin, a phenyl-methyl silicone resin, or a diphenyl silicone resin may be preferably used. The light-transmissive member 40 may contain one or two or more of these base materials.

Examples of the phosphor 80 include cerium-activated yttrium-aluminum-garnet (YAG)-based phosphors, which are adapted to emit green to yellow light; cerium-activated lutetium-aluminum-garnet (LAG)-based phosphors, which are adapted to emit green light; europium- and/or chromium-activated nitrogen-containing calcium aluminosilicate (CaO—$Al_2O_3$—$SiO_2$)-based phosphors, which are adapted to emit green to red light; europium-activated silicate ((Sr, Ba)$_2$SiO$_4$)-based phosphors, which are adapted to emit blue to red light; nitride-based phosphors such as β-SiAlON phosphors, which are adapted to emit green light, and CASN-based phosphors represented by CaAlSiN$_3$:Eu and SCASN-based phosphors represented by (Sr,Ca)AlSiN$_3$:Eu, which are adapted to emit red light; K$_2$SiF$_6$:Mn (KSF)-based phosphors, which are adapted to emit red light; and sulfide-based phosphors, which are adapted to emit red light.

The light-transmissive member 40 may further contain a filler as that can be contained in the first reflective member 20.

Second Reflective Member 50

The second reflective member 50 covers the lateral surfaces of the light-transmissive member 40 and the lateral surfaces of the covering member 30. The second reflective member 50 also covers a portion of each of the lateral surfaces of the first reflective member 20. As shown in FIG. 1B, the second reflective member 50 covers the lateral surfaces of the light-transmissive member 40 to surround the light-transmissive member 40 in a top view. With the second reflective member 50 covering the lateral surfaces of the light-transmissive member 40, the boundary between the light-emitting portion and the non-light-emitting portion on the upper surface 100a of the light-emitting device 101 can be clear (the width of the boundary is narrowed), so that the light-emitting device having good visibility can be obtained. In addition, the lateral surfaces of the second reflective member 50 and the bottom surface of the second reflective member 50 are joined to the first reflective member 20, which allows for increasing bonding strength.

The second reflective member 50 can be made of a material as that can be used for the first reflective member 20. The second reflective member 50 may be made of the same material as the first reflective member 20 or may be made of a material different from the first reflective member 20. With the first reflective member 20 and the second reflective member 50 made of the same material, the bonding strength between the first reflective member 20 and the second reflective member 50 is improved. In addition, the linear expansion coefficients of the first reflective member 20 and the second reflective member 50 can be close to each other, which allows for preventing detachment of the second reflective member 50 from the first reflective member 20 at the interface.

With the second reflective member 50 covering the lateral surfaces of the light-transmissive member 40, the light-emitting device 101 can have good visibility. In addition, the upper surface 20a of the first reflective member 20 is curved such that a thickness of the covering member 30 is gradually increased or a thickness of the first reflective member 20 is gradually reduced in a direction away from the light-emitting element 10. With such a shape, when light emitted from the light-extracting surfaces of the light-emitting elements 10 is reflected by the light-transmissive member 40, the reflected light is reflected again by the curved interface between the covering member 30 and the first reflective member 20 as indicated by the arrows in FIG. 1A such that the reflected light travels away from the light-emitting elements 10, so that incidence of the reflected light on the light-emitting elements 10 and absorption of the reflected light by the light-emitting elements 10 can be reduced. Accordingly, light extraction efficiency of the light-emitting device 101 can be improved.

Method of Manufacturing Light-Emitting Device 101

Figure 2:
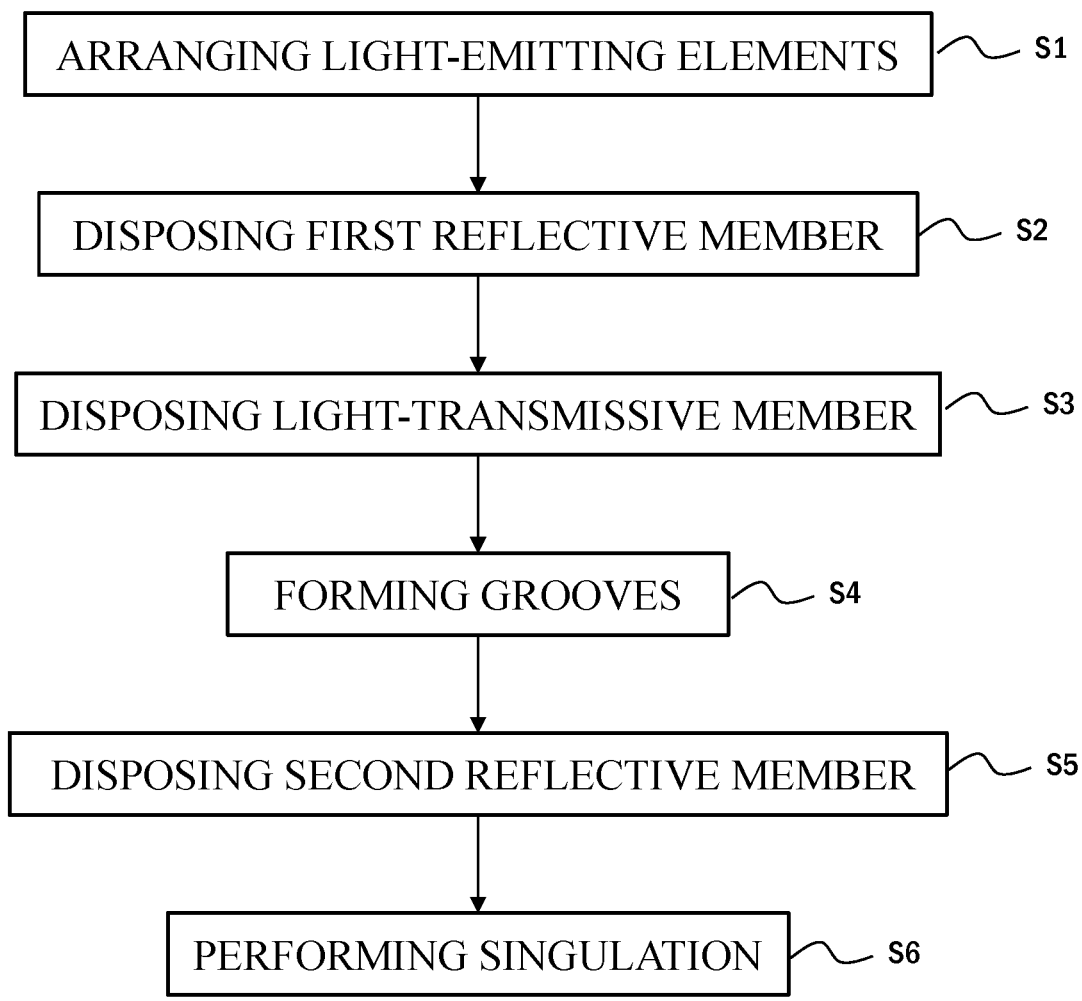
FIG. 2 is a flowchart illustrating a method of manufacturing the light-emitting device according to the first embodiment of the present disclosure.

An example of a method of manufacturing the light-emitting device 101 will be described. FIG. 2 is a flowchart illustrating an example of the method of manufacturing the light-emitting device 101 according to the present embodiment. FIGS. 3A to 3F are schematic cross-sectional views for illustrating steps in the method of manufacturing the light-emitting device 101 according to the present embodiment. The method of manufacturing the light-emitting device 101 according to the present embodiment includes Step S1 of arranging light-emitting elements, Step S2 of disposing a first reflective member, Step S3 of disposing a light-transmissive member, Step S4 of forming grooves, Step S5 of disposing a second reflective member, and Step S6 of performing singulation. The following describes the steps in detail.

Step S1 of Arranging Light-Emitting Elements

A plurality of light-emitting elements 10 are arranged. More specifically, the plurality of light-emitting elements 10 are two-dimensionally arranged on the board 70, in which a number of the light-emitting element(s) 10 to be included in each light-emitting device 101 is considered as a single unit. For example, the board 70, on which electrodes 71 are disposed at positions corresponding to the positions of a plurality of light-emitting elements 10 to be arranged, is provided, and the light-emitting elements 10 are arranged on the upper surface 70a of the board 70. The electrodes 13 and 14 of the light-emitting elements 10 are disposed facing the electrodes 71 of the board 70, and bonded to the electrodes 71 via, for example, bumps or solder. The plurality of light-emitting elements 10 are thus arranged on the upper surface 70a of the board 70 with the upper surfaces 10a of the light-emitting elements 10 facing upward.

In the case where the board 70 is to be removed from the light-emitting device 101 after the light-emitting device 101 is obtained, the light-emitting elements 10 are temporarily attached to the upper surface of an adhesive board so that the light-emitting device 101 can be removed before or after singulation.

Step S2 of Disposing First Reflective Member

The first reflective member 20 is disposed between the light-emitting elements 10 such that the upper surfaces 10a of the light-emitting elements 10 are exposed and such that the lateral surfaces 10c to 10f of the light-emitting elements 10 are covered with first reflective member 20. More specifically, an unhardened material of the first reflective member 20 is disposed on the upper surface 70a of the board 70 by, for example, potting or spraying. At this time, the amount of the unhardened material of the first reflective member 20 is adjusted so that the upper surfaces 10a of the light-emitting elements 10 are not covered. The unhardened material of the first reflective member 20 disposed on the board 70 climbs up the lateral surfaces 10c to 10f of the light-emitting elements 10 due to the surface tension on the lateral surfaces 10c to 10f of the light-emitting elements 10 and the viscosity of the unhardened material of the first reflective member 20, so that the upper surface of the unhardened material of the first reflective member 20 is formed into a curved, concave shape.

Figure 3A:
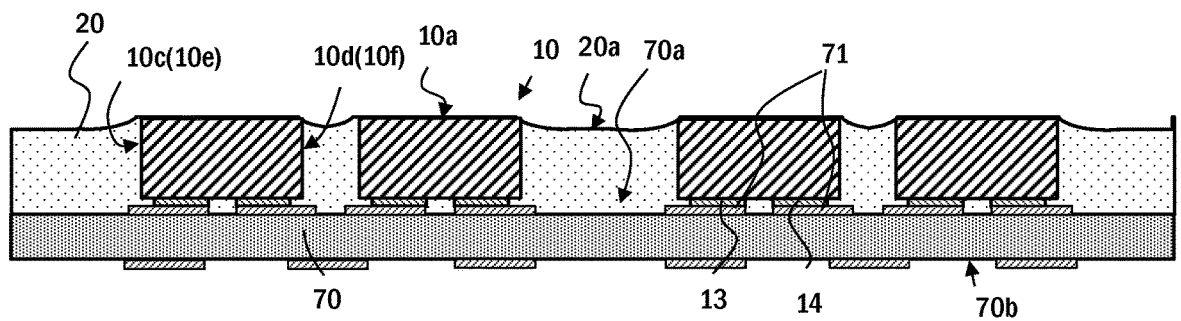
FIG. 3A is a schematic cross-sectional view for illustrating a step in the method of manufacturing the light-emitting device according to the first embodiment of the present disclosure.

After that, the unhardened material of the first reflective member 20 is heated to be hardened. The first reflective member 20 is thus formed as shown in FIG. 3A.

Step S3 of Disposing Light-Transmissive Member

Figure 3B:
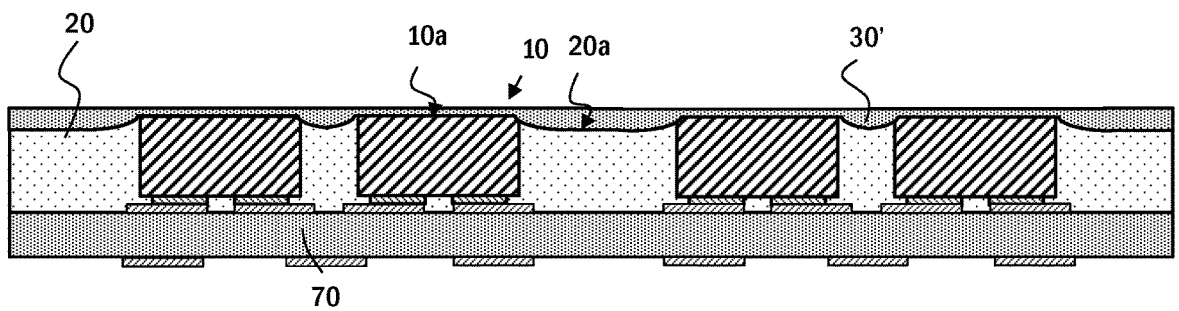
FIG. 3B is a schematic cross-sectional view for illustrating a step in the method of manufacturing the light-emitting device according to the first embodiment of the present disclosure.
Figure 3C:
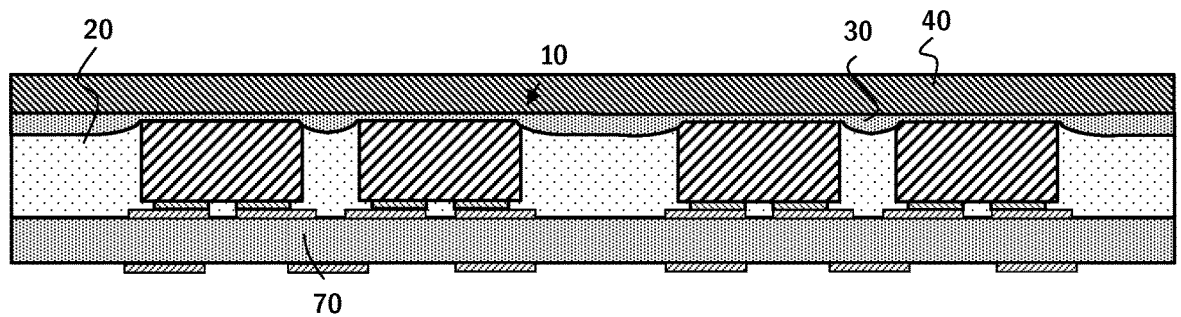
FIG. 3C is a schematic cross-sectional view for illustrating a step in the method of manufacturing the light-emitting device according to the first embodiment of the present disclosure.
Figure 3D:
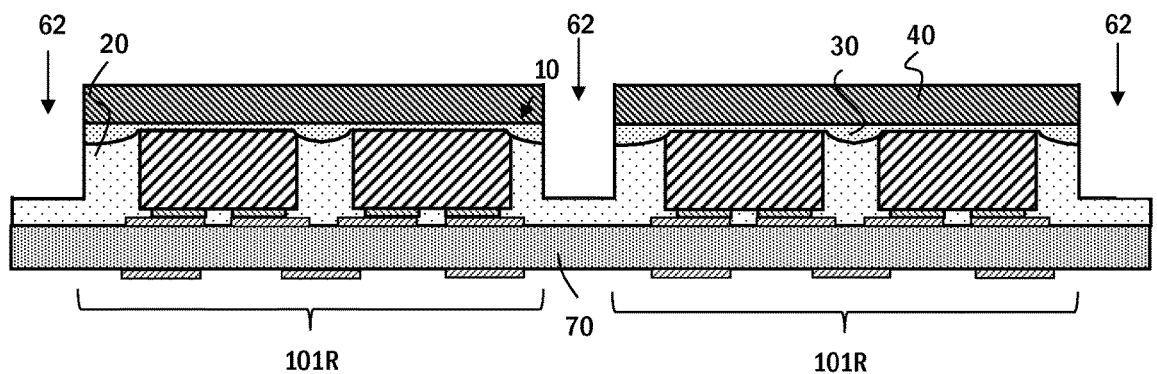
FIG. 3D is a schematic cross-sectional view for illustrating a step in the method of manufacturing the light-emitting device according to the first embodiment of the present disclosure.
Figure 3E:
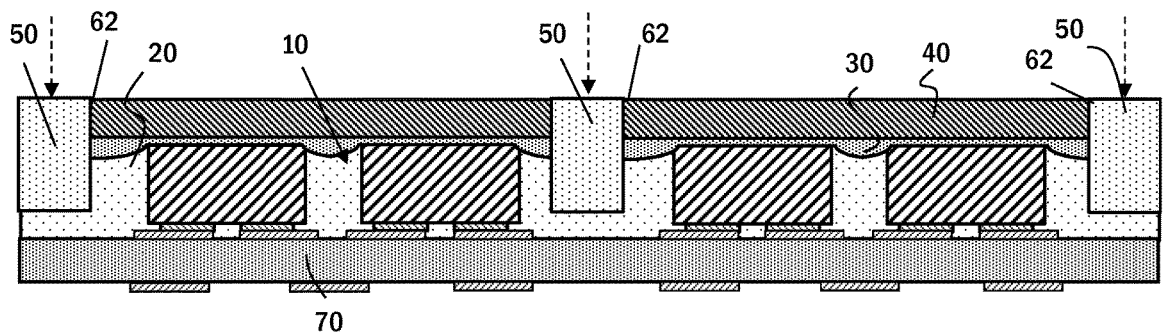
FIG. 3E is a schematic cross-sectional view for illustrating a step in the method of manufacturing the light-emitting device according to the first embodiment of the present disclosure.
Figure 3F:
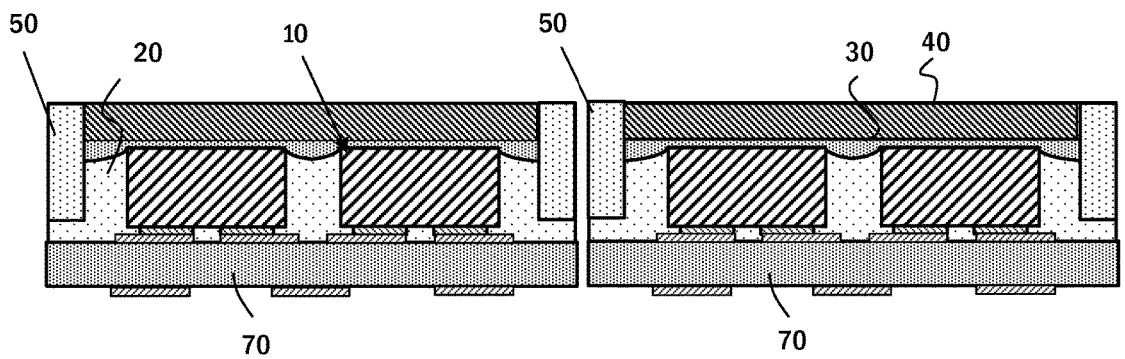
FIG. 3F is a schematic cross-sectional view for illustrating a step in the method of manufacturing the light-emitting device according to the first embodiment of the present disclosure.

A light-transmissive member 40 is disposed on the upper surfaces of the light-emitting elements 10 and the first reflective member 20. More specifically, an unhardened material 30' of the covering member is disposed on the upper surfaces 10a of the light-emitting elements 10 and the upper surface 20a of the first reflective member 20 as shown in FIG. 3B. A plate-like light-transmissive member 40 is then disposed on the unhardened material 30' of the covering member, and the unhardened material 30' of the covering member is heated. The material is hardened by heating, so that the light-transmissive member 40 is bonded to the first reflective member 20 and the light-emitting elements 10. The covering member 30 is thus disposed between the light-transmissive member 40 and the first reflective member 20 as shown in FIG. 3C. It is preferable to perform vacuuming so that no layer of air is left between the plate-like light-transmissive member 40 and the covering member 30.

Step S4 of Forming Grooves

A portion of the light-transmissive member 40 and a portion of the first reflective member 20 is removed to form a plurality of grooves surrounding a respective one or respective two or more of the light-emitting elements 10. In the present embodiment, a portion of the light-transmissive member 40, a portion of the covering member 30, and a portion of the first reflective member 20 is removed. The light-transmissive member 40 and the first reflective member 20 can be removed with, for example, a cutting machine, which is called a dicing saw, having a disc-shaped rotary blade. Parallel double-grooves 62 are formed on the upper surface 40a of the light-transmissive member 40 in two perpendicular directions so as to surround respective light-emitting elements 10 included in each light-emitting device 101 in a top view. Each groove 62 has such a depth that allows the groove 62 to divide the light-transmissive member 40 and the covering member 30 and to reach the first reflective member 20, on the boundary between two adjacent regions 101R, which will be two adjacent light-emitting devices 101. It is preferable that the first reflective member 20 be not divided but be continuous on the board 70. This structure allows for preventing reduction in thickness of the board 70 and therefore allows for preventing reduction in the strength of the board. Lateral surfaces of the light-transmissive member 40, the covering member 30 and the first reflective member 20 form lateral surfaces of the groove 62.

Step S5 of Disposing Second Reflective Member

The second reflective member is disposed to fill the plurality of grooves 62. More specifically, an unhardened material of the second reflective member 50 is filled into the grooves 62 and then hardened by, for example, heating. The second reflective member 50 is thus formed in the grooves 62. In each of the regions 101R that will be light-emitting devices 101, the second reflective member 50 covers the lateral surfaces of the light-transmissive member 40 and the covering member 30, and surrounds the light-transmissive member 40 and the covering member 30 in a top view. The second reflective member 50 is formed by, for example, transfer molding, injection molding, compression molding, or potting.

Step S6 of Performing Singulation

Singulation is performed by cutting at least the second reflective member 50. In the present embodiment, the light-emitting device 101 includes the board 70. Accordingly, the second reflective member 50, the first reflective member 20 under the second reflective member 50, and the board 70 are cut with, for example, a disc-shaped rotary blade, a cutting blade of an ultrasonic cutter, or a push-cutter at the center (indicated by a dashed arrow), at which the boundary between two adjacent regions that are going to be light-emitting devices 101 is located, of the second reflective member 50. Thus, division into the light-emitting devices 101 each mounted on the board 70 is performed, so that individual light-emitting devices 101 can be obtained.

Through this method of manufacturing, a light-emitting device 101 with good visibility can be manufactured even when using a sheet-like light-transmissive member 40. Accordingly, compared to the case of using, for example, light-transmissive members 40 each having a size corresponding to a respective one of light-emitting devices 101, a step that requires precise alignment can be eliminated during manufacturing, so that reduction in the manufacturing cost, reduction in the manufacturing time, improvement in the manufacturing yield, and the like can be achieved.

Further, separately forming the first reflective member 20 and the second reflective member 50 allows for manufacturing a light-emitting device including light-emitting elements 10 in which the lateral surfaces of the light-emitting elements 10 are covered with the first reflective member 20 and in which the lateral surfaces of the light-transmissive member 40 are covered with the second reflective member 50. In the light-emitting device 101, with the lateral surfaces of the light-emitting elements 10 covered with the first reflective member 20, most light is not emitted from the lateral surfaces of the light-emitting device 101, and light enters the light-transmissive member 40 mainly from only the upper surfaces 10a of the light-emitting elements 10. This structure allows for reducing the area of the light-transmissive member 40 on which light is incident, and allows for reducing heat generated by photoelectric conversion of the incident light, so that deterioration of characteristics of the light-transmissive member 40 due to heat can be reduced. This structure is effective particularly in the case where the light-transmissive member has a small area in a top view in a light-emitting device including a plurality of light-emitting elements.

Second Embodiment

Light-Emitting Device 102

Figure 4:
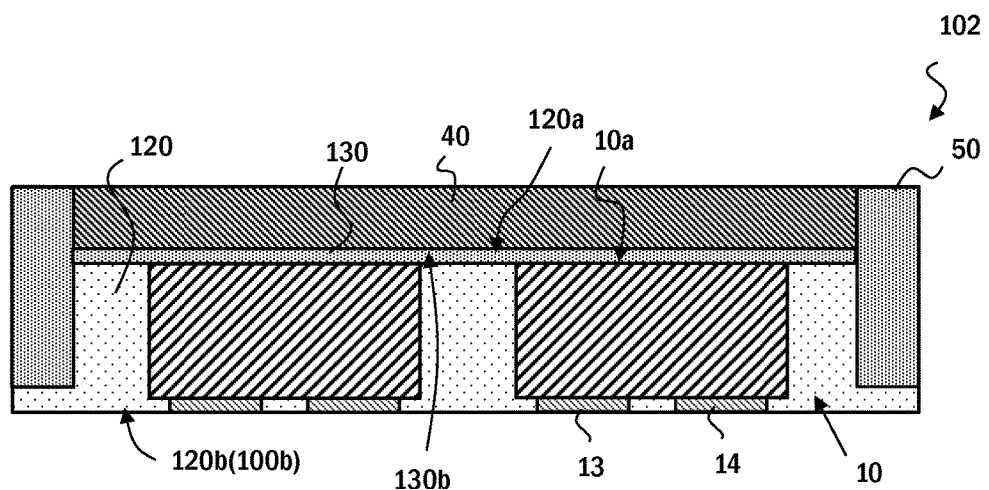
FIG. 4 is a schematic cross-sectional view of a light-emitting device according to a second embodiment of the present disclosure.

FIG. 4 is a schematic cross-sectional view of an example according to a second embodiment of the light-emitting device of the present disclosure. A light-emitting device 102 differs from the light-emitting device 101 according to the first embodiment in that the covering member has a substantially uniform thickness on a first reflective member 120 and in that the board is not included.

In the light-emitting device 102, an upper surface 120a of the first reflective member 120 is not curved but is substantially flat. An upper surface 120a of the first reflective member 120 is located at substantially the same height as an upper surface 10a of each of light-emitting elements 10, and the upper surfaces 10a of the light-emitting elements 10 and the upper surface 120a of the first reflective member 120 constitute a continuous and substantially flat surface. A lower surface 130b of a covering member 130 is substantially flat on the upper surface 120a of the first reflective member 120, and the substantially flat surface continuously covers the first reflective member 120 and the light-emitting elements 10. The covering member 130 therefore has a substantially uniform thickness, regardless of the position relative to the light-emitting elements 10. Also, the light-emitting device 102 does not include a board for mounting, and a lower surface 120b of the first reflective member 120 serves as the lower surface 100b of the light-emitting device 102. The electrodes 13 and 14 are exposed at the lower surface 120b of the first reflective member 120.

Figure 5A:
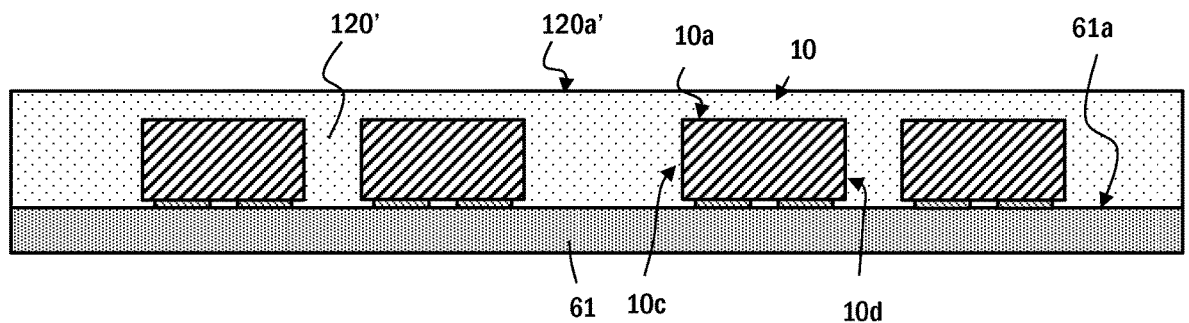
FIG. 5A is a schematic cross-sectional view for illustrating a step in a method of manufacturing the light-emitting device according to the second embodiment of the present disclosure.
Figure 5B:
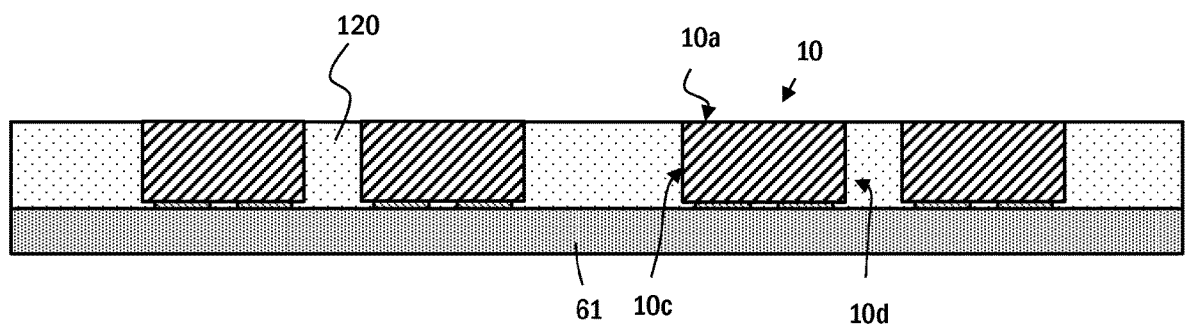
FIG. 5B is a schematic cross-sectional view for illustrating a step in the method of manufacturing the light-emitting device according to the second of the present disclosure.

The light-emitting device 102 can be produced through a method different from the manufacturing process of the light-emitting device 101 according to the first embodiment in Step S2 of disposing a first reflective member and Step S6 of performing singulation. FIG. 5A and FIG. 5B are schematic cross-sectional views for illustrating Step S2 of disposing a first reflective member in the method of manufacturing of the light-emitting device 102. For example, a plurality of light-emitting elements 10 are arranged on and temporarily attached to a board 61 having an upper surface 6a with adhesiveness, and the unhardened material of the first reflective member 20 is disposed on an upper surface 61a of the board 61 so that the light-emitting elements 10 are entirely covered with the unhardened material of the first reflective member 20, in other words, so that the upper surfaces 10a and the lateral surfaces 10c to 10f of the light-emitting elements 10 are covered with the unhardened material of the first reflective member 20. After that, the unhardened material of the first reflective member 20 is hardened. A first reflective member 120' covering the upper surfaces 10a and the lateral surfaces 10c to 10f of the light-emitting elements 10 is thus obtained as shown in FIG. 5A. A method such as transfer molding, injection molding, compression molding, and potting can be used in the step of disposing the first reflective member 120'.

Subsequently, a portion of the first reflective member 120' at an upper surface 120a' side is removed so that the upper surface 10a of each of the light-emitting elements 10 is exposed from the first reflective member 120'. For example, the first reflective member 120' is polished until the upper surface 10a of each of the light-emitting elements 10 is exposed. A lapping machine, which grinds or flattens various substrates, insulating layers, and other members used in the manufacture of semiconductor devices, can be used for the polishing. For the polishing, as well as mechanical polishing, chemical-mechanical polishing may be employed. The light-transmissive substrate 11 is located at the upper surface 10a of each of the light-emitting elements 10 as shown in FIG. 1C, and a portion of the light-transmissive substrate 11 may also be removed. By performing overgrinding such that a portion of the light-transmissive substrate 11 is removed, the upper surface 10a of each of the light-emitting elements 10 is more surely exposed. Accordingly, the first reflective member 120 covering the lateral surfaces 10c to 10f of the light-emitting elements 10 such that the upper surfaces 10a are exposed can be obtained as shown in FIG. 5B. After that, the covering member 130, the light-transmissive member 40, and the second reflective member 50 are formed through steps as in the method of manufacturing the light-emitting device 101.

Figure 5C:
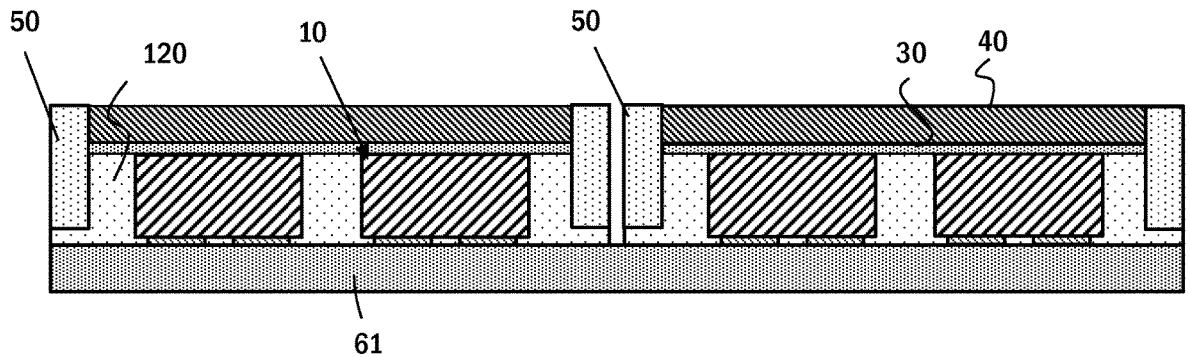
FIG. 5C is a schematic cross-sectional view for illustrating a step in the method of manufacturing the light-emitting device according to the second of the present disclosure.

FIG. 5C is a schematic cross-sectional view for illustrating Step S6 of performing singulation in the method of manufacturing the light-emitting device 102. As described in the first embodiment, the second reflective member 50 and the first reflective member 20 under the second reflective member 50 are cut using, for example, a disc-shaped rotary blade, a cutting blade of an ultrasonic cutter, or a push-cutter until the cut reaches the board 61 at the center, at which the boundary between two adjacent regions that will be light-emitting devices is located, of the second reflective member 50. Division into the light-emitting devices 102 is thus performed with the light-emitting devices 102 bonded to the board 61 as shown in FIG. 5C. The board 61 is then removed, so that the individual light-emitting devices 102 are manufactured.

Other Embodiments

Figure 6:
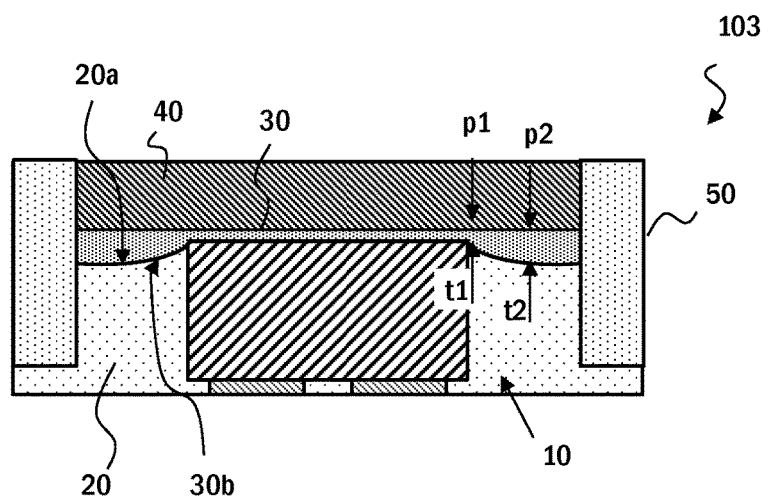
FIG. 6 is a schematic cross-sectional view of a light-emitting device according to another embodiment of the present disclosure.

The light-emitting device according to the present disclosure is not limited to the above embodiments, and various modifications are possible. As described above, the light-emitting device 101 may include a single light-emitting element 10. As shown in FIG. 6, a light-emitting device 103 includes a single light-emitting element 10. As in the first embodiment, the first reflective member 20 is disposed surrounding the light-emitting elements 10 to cover the lateral surfaces of the light-emitting elements 10. The upper surface 20a of the first reflective member 20 defines a curved recess. The lower surface 30b of the covering member 30 in contact with the upper surface 20a of the first reflective member 20 has a curved shape protruding toward the first reflective member 20. Accordingly, in the region between the light-emitting element 10 and the second reflective member 50, the covering member 30 has a first thickness at a first position p1, which is located near the light-emitting element 10, and a second thickness at a second position p2, which is located farther from the light-emitting element 10, in other words, closer to the second reflective member 50, than the first position p1, such that the second thickness is greater than the first thickness. That is, when the first thickness at the first position p1 and the second thickness at the second position p2 of the covering member are represented by t1 and t2, respectively, t2 is larger than t1.

The light-emitting device 103 also includes the covering member 30 having the shape as described above, so that the light extraction efficiency of the light-emitting device 103 can be improved.

Figure 7:
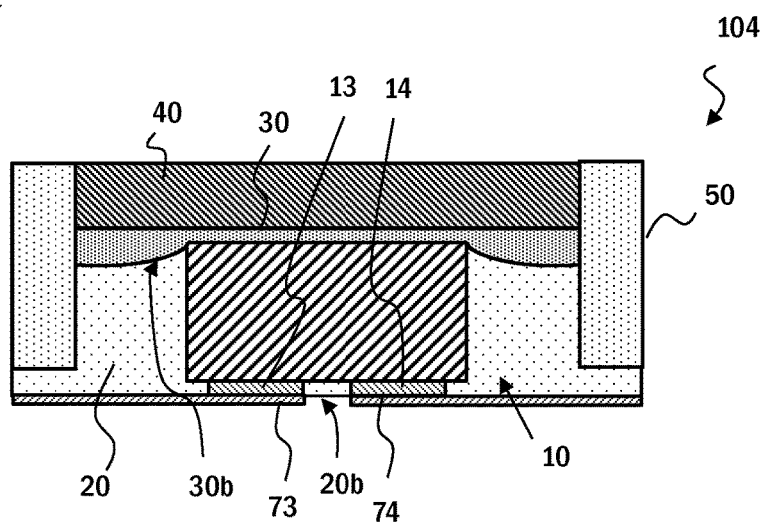
FIG. 7 is a schematic cross-sectional view of a light-emitting device according to still another embodiment of the present disclosure.

The light-emitting device may include electrodes at the lower surface of the first reflective member. As shown in FIG. 7, a light-emitting device 104 further includes electrodes 73 and 74 disposed at the lower surface 120b of the first reflective member 120. The electrodes 73 and 74 overlap the electrodes 13 and 14 of the light-emitting element 10 and are electrically connected to the electrodes 13 and 14, respectively. The electrodes 13 and 14 can be formed using, for example, the method described in Japanese Unexamined Patent Application Publication No. 2017-118098.

Figure 8:
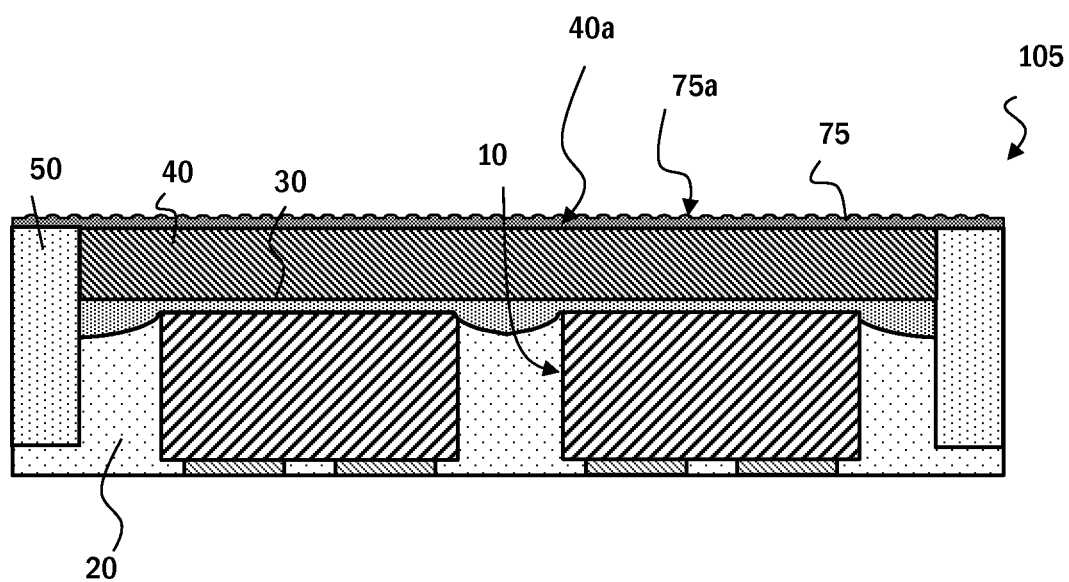
FIG. 8 is a schematic cross-sectional view of a light-emitting device according to still another embodiment of the present disclosure.

The light-emitting device may include another constituent element on its upper surface. For example, a light-emitting device 105 shown in FIG. 8 includes, on the upper surface 40a of the light-transmissive member 40, a transparent resin layer 75 having irregularities. The transparent resin layer 75 contains, for example, particles and resin. The transparent resin layer 75 may be formed on the entire upper surface 40a or formed in the form of stripes or dots on portions of the upper surface 40a. The transparent resin layer 75 can be formed by, for example, spraying or applying at least on the upper surface 40a of the light-transmissive member 40, after the light-transmissive member 40 is disposed. The transparent resin layer 75 may also be disposed on the upper surface of the second reflective member 50.

An upper surface 75a of the transparent resin layer 75 has a larger surface roughness Ra than the upper surface 40a of the light-transmissive member 40. The transparent resin layer 75 can be disposed for various purposes. For example, the purpose may be to reduce stickiness (tackiness) of an upper surface 105a of the light-emitting device 105, to allow the upper surface 105a of the light-emitting device 105 to diffusely reflect external light, or to adjust distribution of light emitted from the light-transmissive member 40.

Figure 9:
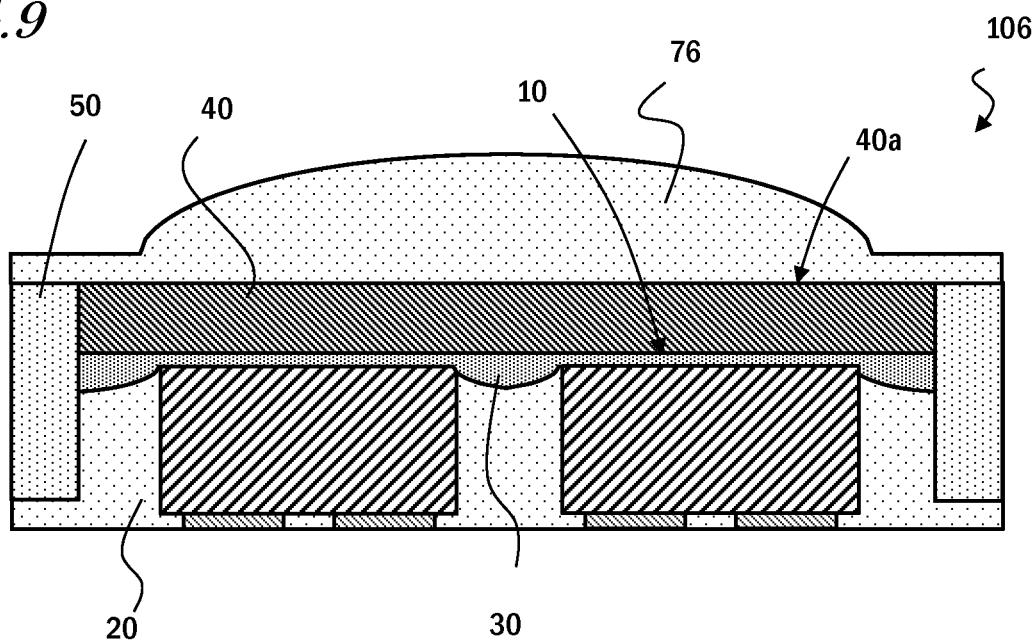
FIG. 9 is a schematic cross-sectional view of a light-emitting device according to still another embodiment of the present disclosure.

As shown in FIG. 9, a light-emitting device 106 may include a lens 76 on the upper surface 40a of the light-transmissive member 40. The lens 76 is made of a light-transmissive member and adjusts distribution of light emitted from the light-transmissive member 40. After disposing a second reflective member, the lens 76 made of a light-transmissive member can be bonded to the upper surface 40a of the light-transmissive member 40 over one or two or more light-emitting elements 10 with an adhesive, and the lens 76 can be formed by, for example, transfer molding, injection molding, compression molding, or potting.

The light-emitting device according to the present disclosure can be suitably used as light-emitting devices for various uses.

What is claimed is:

1. A light-emitting device comprising:
   at least one light-emitting element including lateral surfaces and a light-extracting surface;
   a first reflective member including an upper surface, covering the lateral surfaces of the light-emitting element;
   a covering member including lateral surfaces and a lower surface and disposed over the light-extracting surface of the light-emitting element and the upper surface of the first reflective member;
   a light-transmissive member including lateral surfaces and disposed on the covering member and comprising a phosphor; and
   a second reflective member covering the lateral surfaces of the light-transmissive member and the lateral surfaces of the covering member,
   wherein the lower surface of the covering member in contact with the upper surface of the first reflective member is curved,
   wherein the covering member has a first thickness at a first position and a second thickness at a second position, the second thickness being greater than the first thickness, the first position being closer to the light emitting element than the second position, and
   wherein the first reflective member includes a white pigment.

2. The light-emitting device according to claim 1, wherein the light-emitting device comprises a plurality of the light-emitting elements, and
   wherein, between two adjacent light-emitting elements of the plurality of light-emitting elements, the covering member has a third thickness at a third position and a fourth thickness at a fourth position, the fourth thickness being greater than the third thickness, the third position being closer to one of the two light emitting elements than the fourth position.

3. The light-emitting device according to claim 1, wherein the light-transmissive member is a sheet-like member.

4. The light-emitting device according to claim 1, wherein the first reflective member covers a lateral surface of the second reflective member.

5. The light-emitting device according to claim 4, wherein the first reflective member covers a bottom surface of the second reflective member.

6. The light-emitting device according to claim 1, wherein the first reflective member and the second reflective member are made of the same material.

7. The light-emitting device according to claim 1, further comprising an electrode at a lower surface of the first reflective member.

8. The light-emitting device according to claim 1, further comprising a transparent resin layer that covers the light-transmissive member and the second reflective member.

9. The light-emitting device according to claim 8, wherein the transparent resin layer has irregularities.

10. The light-emitting device according to claim 1, further comprising a lens that covers the light-transmissive member and the second reflective member.

11. The light-emitting device according to claim 1, wherein the covering member is transparent.

12. The light-emitting device according to claim 1, comprising four light-emitting element including the at least one light-emitting element, wherein the four light-emitting elements are arranged in a two rows and two columns along two directions perpendicular to each other.

13. A light-emitting device comprising:
- at least one light-emitting element including lateral surfaces and a light-extracting surface;
- a first reflective member including an upper surface, covering the lateral surfaces of the light-emitting element;
- a covering member including lateral surfaces and a lower surface and disposed over the light-extracting surface of the light-emitting element and the upper surface of the first reflective member;
- a light-transmissive member including lateral surfaces and disposed on the covering member and comprising a phosphor; and
- a second reflective member covering the lateral surfaces of the light-transmissive member and the lateral surfaces of the covering member,
    - wherein an upper surface of the at least one light-emitting element and an upper surface of the first reflective member constitute a continuous and substantially flat surface, and
    - wherein the first reflective member includes a white pigment.

14. The light-emitting device according to claim 13, wherein the light-transmissive member is a sheet-like member.

15. The light-emitting device according to claim 13, wherein the first reflective member covers a lateral surface of the second reflective member.

16. The light-emitting device according to claim 15, wherein the first reflective member covers a bottom surface of the second reflective member.

17. The light-emitting device according to claim 13, wherein the first reflective member and the second reflective member are made of the same material.

18. The light-emitting device according to claim 13, wherein the covering member is transparent.

* * * * *